(12) United States Patent
Saito

(10) Patent No.: US 7,422,955 B2
(45) Date of Patent: Sep. 9, 2008

(54) METHOD FOR MANUFACTURING A SEMICONDUCTOR DEVICE, AS WELL AS A SEMICONDUCTOR SUBSTRATE

(75) Inventor: Takeshi Saito, Matsumoto (JP)

(73) Assignee: Seiko Epson Corporation (JP)

( * ) Notice: Subject to any disclaimer, the term of this patent is extended or adjusted under 35 U.S.C. 154(b) by 287 days.

(21) Appl. No.: 11/402,590

(22) Filed: Apr. 12, 2006

(65) Prior Publication Data

US 2006/0234468 A1    Oct. 19, 2006

(30) Foreign Application Priority Data

Apr. 13, 2005    (JP)    ............................. 2005-115391

(51) Int. Cl.
*H01L 21/76*    (2006.01)
*H01L 29/00*    (2006.01)
(52) U.S. Cl. ...................................... 438/401; 257/506
(58) Field of Classification Search ......... 438/400–404, 438/424, 427; 257/506, 524
See application file for complete search history.

(56) References Cited

U.S. PATENT DOCUMENTS

| 6,495,896 B1 * | 12/2002 | Yaegashi et al. | ............ 257/500 |
| 6,790,781 B2 * | 9/2004 | Trivedi | ...................... 438/700 |
| 6,798,038 B2 * | 9/2004 | Sato et al. | ................... 257/510 |
| 2004/0195632 A1 | 10/2004 | Sato | |

FOREIGN PATENT DOCUMENTS

JP    2004-260073    9/2004

* cited by examiner

*Primary Examiner*—Calvin Lee
(74) *Attorney, Agent, or Firm*—Harness, Dickey & Pierce, P.L.C.

(57) ABSTRACT

A method for manufacturing a semiconductor device, includes: forming a recognition mark that defines a well-forming region for forming a well on a semiconductor substrate; forming a mask, using the recognition mark, that is patterned so that the well-forming region is opened; introducing an impurity into the well-forming region; performing heat treatment for forming a well by diffusing the impurity; and forming an element isolation region on the semiconductor substrate.

5 Claims, 3 Drawing Sheets (a)

(b)

METHOD FOR MANUFACTURING A SEMICONDUCTOR DEVICE, AS WELL AS A SEMICONDUCTOR SUBSTRATE

The entire disclosure of Japanese Patent Application No. 2005-115391, filed Apr. 13, 2005 is expressly incorporated by reference herein.

BACKGROUND

1. Technical Field

The present invention relates to a method for manufacturing a semiconductor device, especially a method for manufacturing a semiconductor device, as well as a semiconductor substrate, that can reduce the possibility of, for example, crystal defects occurring from an element isolation region.

2. Related Art

In a method for manufacturing a semiconductor device having an element isolation region, especially a high-breakdown-voltage transistor, an element isolation region is formed on a semiconductor substrate first, and then a well is formed by introducing an impurity into an element-forming region, which is the region other than the element isolation region, and performing a long-time heat treatment for uniform diffusion of the impurity within a desired region on the semiconductor substrate, as disclosed in JP-A-2004-260073, which is an example of related art.

In the above method, however, a heat stress is applied due to the heat treatment that is performed in forming a well on a semiconductor substrate on which an element isolation region is formed. Such a heat stress can cause problems of crystal defects, as well as cracks due to, for example, the concentration of such crystal defects.

SUMMARY

An advantage of the invention is to provide a method for manufacturing a semiconductor device that can reduce the possibility of crystal defects occurring from an element isolation region.

According to a first aspect of the invention, a method for manufacturing a semiconductor device includes: forming a recognition mark that defines a well-forming region for forming a well on a semiconductor substrate; forming a mask, using the recognition mark, that is patterned so that the well-forming region is opened; introducing an impurity into the well-forming region; performing heat treatment for forming a well by diffusing the impurity; and forming an element isolation region on the semiconductor substrate.

In the method for manufacturing a semiconductor device according to the first aspect of the invention, a recognition mark that defines a well-forming region that is provided for forming a well on a semiconductor substrate is formed. After forming the recognition mark, a well is formed by introducing an impurity and performing a heat treatment. Then, an element isolation region is formed. By the above method, even if a heat stress is applied to a semiconductor substrate during the heat treatment for diffusing an impurity, which is required in forming a well, into the semiconductor substrate, defects attributed to, for example, current leakage due to, for example, crystal defects occurring from an element isolation region can be reduced because no element isolation regions are formed yet, unlike the known manufacturing method wherein a well is formed after an element isolation region is formed.

Further, in the method for manufacturing a semiconductor device according to the first aspect of the invention, the formation of a recognition mark further includes: forming, on the semiconductor substrate, a surface protection film for protecting the surface of the semiconductor substrate; forming, on the surface protection film, a recognition-mark mask that is patterned so that a region in which a recognition mark is to be formed is opened; forming a concave recognition mark on the semiconductor substrate by etching the surface protection film and part of the semiconductor substrate; stripping the recognition-mark mask; and forming a protection film on the walls and base of the concave recognition mark.

Further, in the first aspect of the invention, it is preferable that the protection film is configured of a two-layer film.

It is also preferable that the protection film is configured of a silicon oxide film and a silicon nitride film that is formed on the silicon oxide film.

Further, in the first aspect of the invention, it is preferable that the element isolation region is configured of STI.

Further, according to a second aspect of the invention, a semiconductor substrate includes a recognition mark for forming a well, which is formed before forming an element isolation region.

With the semiconductor substrate according to the second aspect of the invention, since a recognition mark for forming a well is formed before forming an element isolation region, no element isolation regions are formed yet, unlike the known method wherein a well is formed after an element isolation region is formed, using the formed element isolation region as a mark for forming a well. Therefore, the heat stress generated by, for example, a high-temperature heat treatment for forming a well in an element isolation region is never applied to the element isolation region. Hence, defects attributed to, for example, current leakage due to, for example, crystal defects occurring from an element isolation region can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of a semiconductor device and a method for manufacturing the semiconductor device according to the first and second aspects of the invention will now be described with reference to the accompanying drawings.

Figure 1:
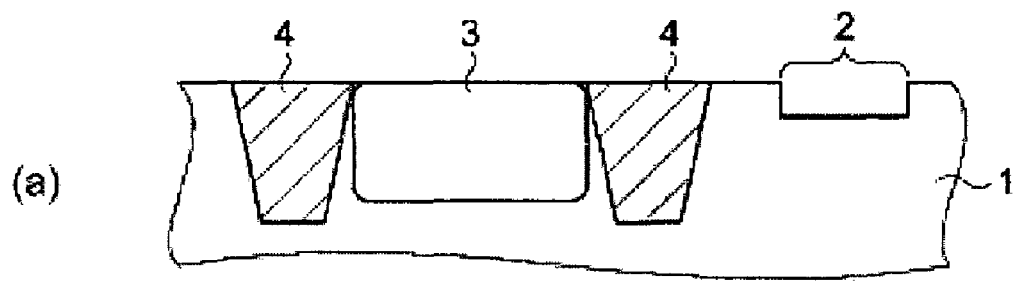
FIG. 1A is a schematic cross section of a semiconductor substrate on which a recognition mark is formed.
FIG. 1B is a schematic plan view of a semiconductor substrate on which recognition marks are formed.
Figure 1:
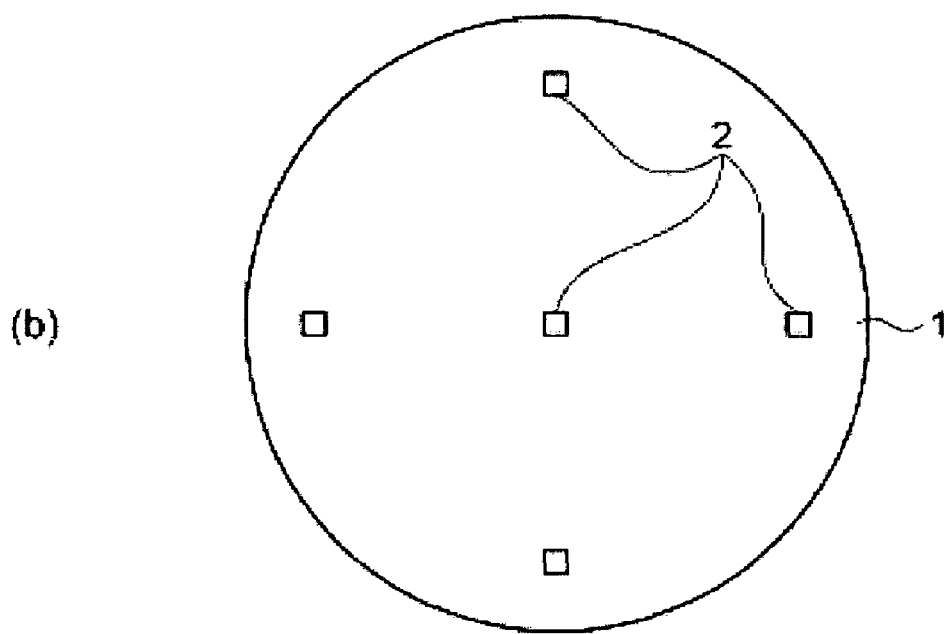

FIG. 1A is a schematic cross section showing a silicon substrate as a semiconductor substrate in an embodiment of the invention. In a silicon substrate 1, element isolation regions (hereinafter called STIs) 4 having a configuration of shallow trench isolation (STI) are provided. Between the STIs 4, by introducing an impurity such as boron ions, phosphorus ions, etc., a well 3 having a desired depth from the surface of the silicon substrate 1 is formed. Further, at a desired position in the silicon substrate 1, a recognition mark 2 is provided in a concave shape as scraped from the surface of the silicon substrate 1.

FIG. 1B is a schematic plan view of a silicon substrate according to the embodiment.

The silicon substrate 1 has recognition marks 2 at predefined positions. In FIG. 1B, one of the recognition marks 2 is provided near the center and the other four on the periphery of the silicon substrate 1. In addition, in the silicon substrate 1 in FIG. 1B, the well 3 and the STIs 4, which are described in FIG. 1A, are not formed yet. Using the recognition marks 2, where to form the well 3 and the STIs 4 is defined.

In addition, the positions and number of the recognition marks 2 to be formed are arbitrary as long as the recognition marks 2 can define the positions for forming the well 3 and the STIs 4.

Next, steps for forming the recognition mark 2 will be described with reference to the cross sections in FIGS. 2A to 2E.

Figure 2:
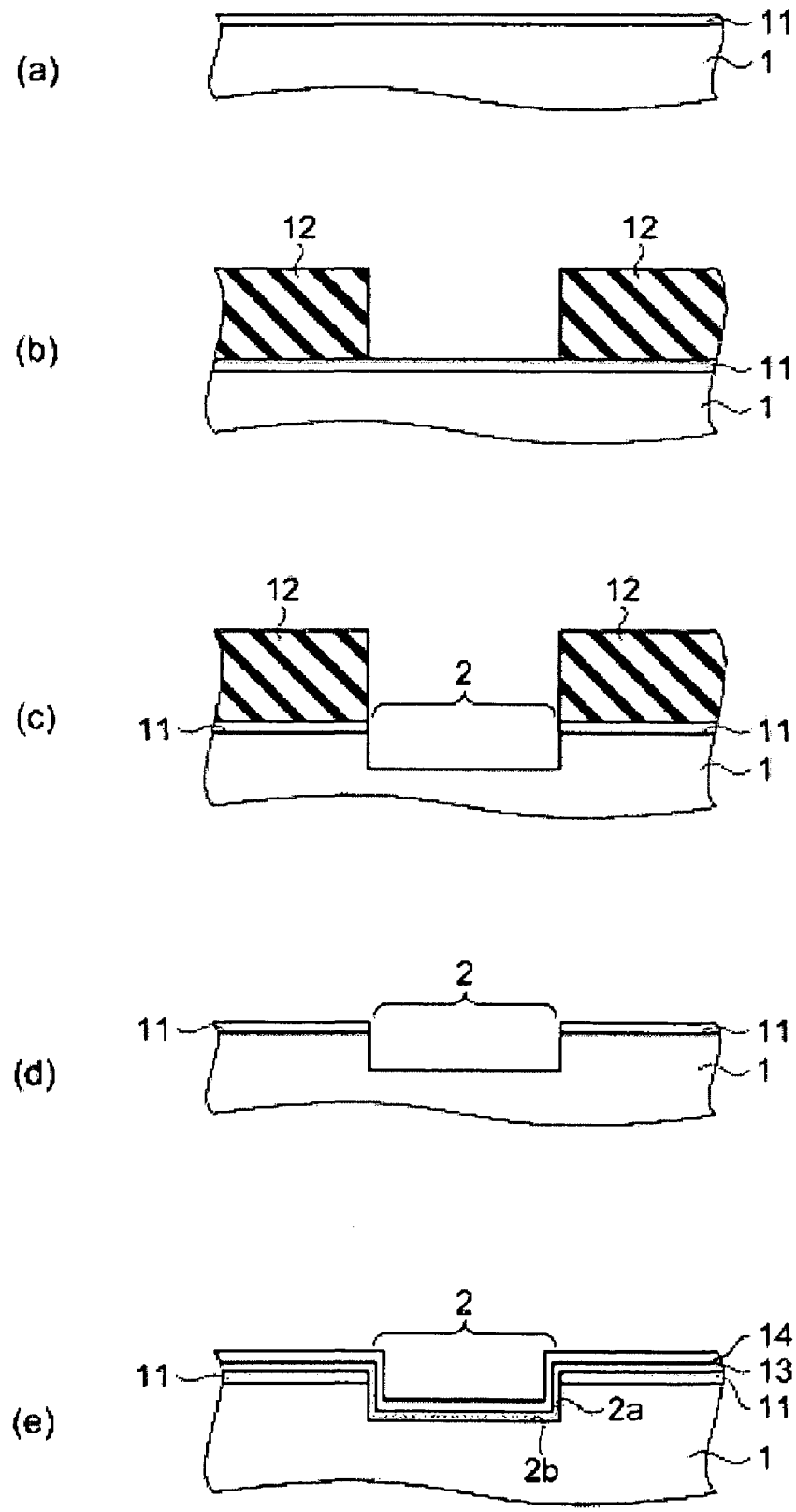
FIGS. 2A to 2E are cross sections showing manufacturing steps for forming a recognition mark.

FIG. 2A shows a step for forming a surface protection film. On the silicon substrate 1, a silicon oxide film 11 is formed, as a surface protection film for protecting the surface of the silicon substrate 1, by means of thermal oxidation. The thickness of the silicon oxide film 11 is defined within the range of 10 nm or more and 50 nm or less.

In addition, the silicon oxide film 11 serving as a surface protection film must not necessarily be formed if there is no possibility of roughness, crystal defects, etc. on the surface of the silicon substrate 1 in later steps.

FIG. 2B shows a step for forming a recognition-mark mask. A photoresist 12 is formed as a recognition-mark mask by means of photolithography so that a region in which the recognition mark 2 (refer to FIG. 2C) is to be formed is opened. The thickness of the photoresist 12 is within the range of 500 nm or more and 2000 nm or less.

FIG. 2C shows a step for forming a recognition mark. The concave recognition mark 2 is formed on the silicon substrate 1 by performing dry etching for the entire surface of the silicon substrate 1, on which the photoresist 12 is formed, so as to etch the silicon substrate 1 through the opening of the photoresist 12.

FIG. 2D shows a step for stripping the recognition-mark mask. Using sulfuric acid or a photoresist-stripping liquid, the photoresist 12 is stripped from the silicon substrate 1. Further, the residue of the photoresist 12 can be removed by means of ashing.

FIG. 2E shows a step for forming a protection film. On the entire surface of the silicon substrate 1, on which the recognition mark 2 is formed, a silicon nitride film 13 and a silicon oxide film 14 are formed by means of plasma enhanced chemical vapor deposition (PECVD). The thickness of the silicon nitride film 13 is within the range of 10 nm or more and 50 nm or less. Further, the thickness of the silicon oxide film 14 is within the range of 10 nm or more and 50 nm or less. By the above method, a two-layer protection film configured of the silicon nitride film 13 and the silicon oxide film 14 is formed on walls 2a and a bottom 2b of the concavity serving as the recognition mark 2.

By forming the recognition mark 2 on the silicon substrate 1 as above, a region for forming the well 3 can be defined without forming element isolation regions such as the STIs 4, etc., unlike the known method wherein the STIs 4, etc. need to be formed to define a region for forming the well 3 using the formed STIs 4, etc.

In addition, if the recognition mark 2 can be kept recognizable in later steps for forming a well and element isolation regions, the two-layer configuration including the silicon nitride film 13 and the silicon oxide film 14 can be changed to a single-layer configuration including only either of the silicon nitride film 13 and the silicon oxide film 14.

Next, a method for manufacturing a semiconductor device wherein the well 3 and the STIs 4 are formed in the silicon substrate 1 using the recognition mark 2 will be described with reference to the cross sections in FIGS. 3A to 3E.

Figure 3:
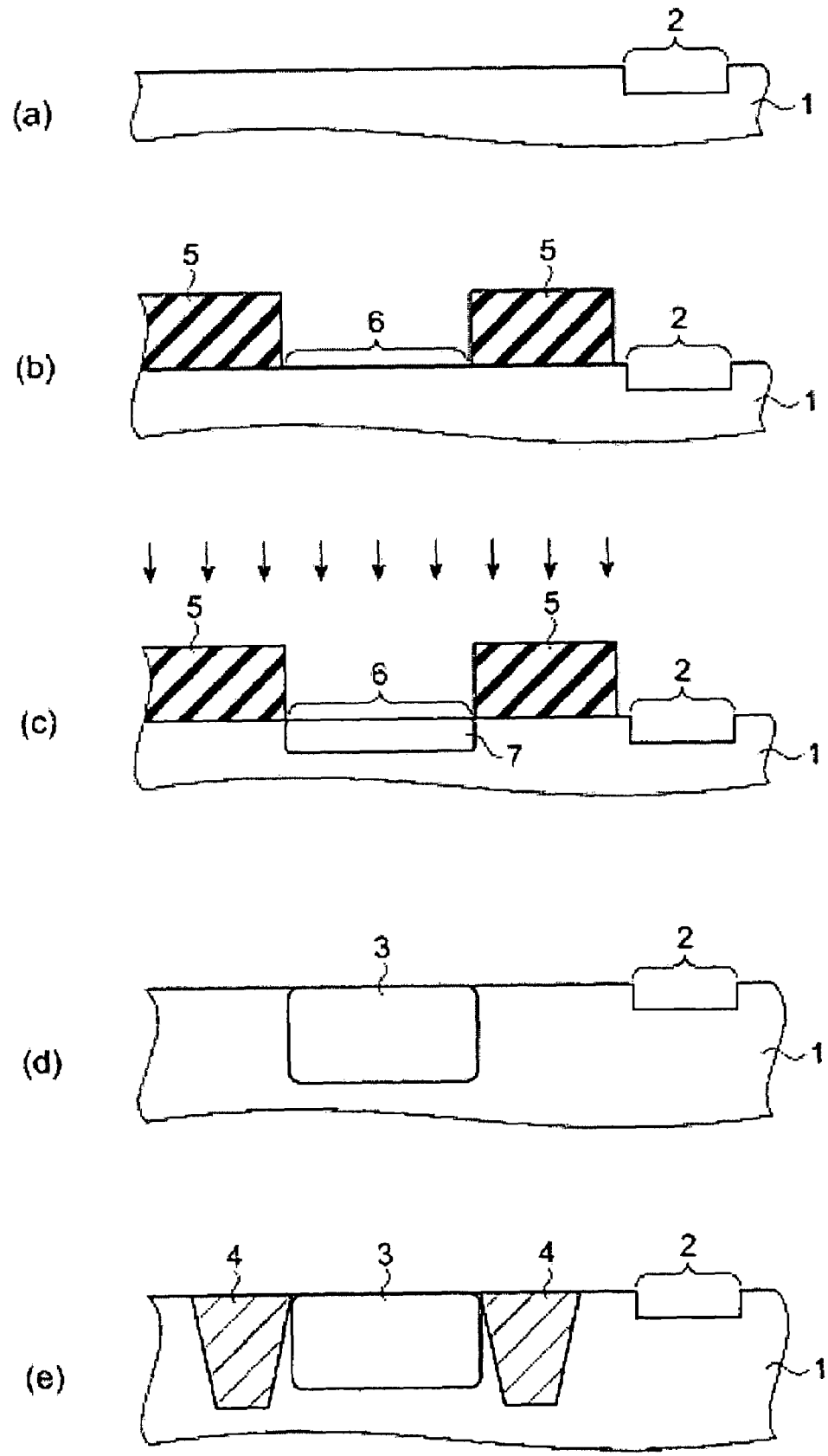
FIGS. 3A to 3E are cross sections showing manufacturing steps for forming a well and element isolation regions.

FIG. 3A shows a silicon substrate for forming a well and STIs as element isolation regions. The same as in the above-described step for forming a recognition mark, the recognition mark 2 is formed on the silicon substrate 1.

FIG. 3B shows a step for forming a mask. A photoresist 5, which is to become a mask, is applied all over the silicon substrate 1. Next, with reference to the recognition mark 2, a photomask (not illustrated) for opening a well-forming region 6 in the photoresist 5 is aligned approximately with the silicon substrate 1. Then, by performing exposure using a reduced-projection exposure apparatus (a stepper) and developing the photoresist 5, the photoresist 5 having a pattern in which the well-forming region 6 is opened is formed.

FIG. 3C shows a step for introducing an impurity. By means of ion implantation, ions as an impurity are introduced into the well-forming region 6 to form an impurity introduction region 7. The ions as an impurity need to be B ions, etc. if the p-polarity is given to the well 3 to be formed; or P ions or As ions, etc. if the n-polarity is given to the well 3 to be formed.

FIG. 3D shows a heat treatment step. In the heat treatment, a temperature of 900 degrees Celsius or higher is applied entirely to the silicon substrate 1. By this method, the ions introduced into the impurity introduction region 7 are diffused inside the silicon substrate 1. The region where the impurity is diffused is to serve as the well 3.

FIG. 3E shows a step for forming element isolation regions. The STIs 4 as element isolation regions are formed near the well 3. In order to form the STIs 4, trenches are formed at desired positions by means of, for example, dry etching, etc. Next, an insulative film such as a silicon oxide film, etc. is formed all over the silicon substrate 1 so as to fill the trenches. Then, by means of dry etching or chemical mechanical polishing (CMP), the unnecessary part of the film is removed.

By performing the above steps, the following effects can be derived: even if a heat stress is applied to the silicon substrate 1 during the heat treatment step for diffusing an impurity, which is required in forming the well 3, into the silicon substrate 1, no STIs 4 are formed yet on the silicon substrate 1. Therefore, unlike the known method wherein the well 3 is formed after the STIs 4 are formed, defects attributed to, for example, current leakage due to, for example, crystal defects occurring from the STIs 4 can be reduced.

In addition, the embodiment is not limited to the above-described case where element isolation regions are formed using STI but also applicable to other cases using LOCOS, planar LOCOS, etc.

What is claimed is:

1. A method for manufacturing a semiconductor device, comprising:
    forming a recognition mark that defines a well-forming region for forming a well on a semiconductor substrate;
    forming a mask, using the recognition mark, that is patterned so that the well-forming region is opened;
    introducing an impurity into the well-forming region;
    performing heat treatment for forming a well by diffusing the impurity; and
    forming an element isolation region on the semiconductor substrate after forming the well.

2. The method for manufacturing a semiconductor device according to claim 1, wherein the formation of a concave recognition mark further includes:

forming, on the semiconductor substrate, a surface protection film for protecting a surface of the semiconductor substrate;

forming, on the surface protection film, a recognition-mark mask that is patterned so that a region in which the concave recognition mark is to be formed is opened;

forming the concave recognition mark on the semiconductor substrate by etching the surface protection film and part of the semiconductor substrate;

removing the recognition-mark mask; and forming a protection film on walls and base of the concave recognition mark.

3. The method for manufacturing a semiconductor device according to claim 2, wherein the protection film comprises a two-layer film.

4. The method for manufacturing a semiconductor device according to claim 3, wherein the protection film is configured of a silicon oxide film and a silicon nitride film that is formed on the silicon oxide film.

5. The method for manufacturing a semiconductor device according to claim 1, wherein the element isolation region is configured of STI.

* * * * *